US008274409B2

(12) United States Patent
Lin et al.

(10) Patent No.: US 8,274,409 B2
(45) Date of Patent: Sep. 25, 2012

(54) LIGHT-EMITTING KEYBOARD

(75) Inventors: Chin-Hung Lin, Taipei County (TW); Chao-Lung Chang, Miaoli County (TW)

(73) Assignee: Darfon Electronics Corp., Taoyuan (TW)

( * ) Notice: Subject to any disclaimer, the term of this patent is extended or adjusted under 35 U.S.C. 154(b) by 474 days.

(21) Appl. No.: 12/685,252

(22) Filed: Jan. 11, 2010

(65) Prior Publication Data

US 2010/0188269 A1 Jul. 29, 2010

(30) Foreign Application Priority Data

Jan. 23, 2009 (TW) ............................... 98201473 U

(51) Int. Cl.
*H03M 11/00* (2006.01)

(52) U.S. Cl. .......... 341/22; 345/173; 345/170; 345/168; 200/314; 200/310; 200/344; 200/5 A; 400/472; 363/24

(58) Field of Classification Search .................... 340/22; 345/168, 170, 173; 200/314, 310, 344, 5 A; 400/472; 362/24
See application file for complete search history.

(56) References Cited

U.S. PATENT DOCUMENTS 6,648,530 B2 * 11/2003 Kamei et al. .................. 400/472
7,709,760 B2 * 5/2010 Chen et al. .................... 200/314
2005/0270760 A1 * 12/2005 Hung .............................. 362/23
2006/0038788 A1 * 2/2006 Tai ................................ 345/168
2010/0147662 A1 * 6/2010 Yeh et al. ...................... 200/314
2010/0176974 A1 * 7/2010 Ho .................................. 341/22
2010/0188269 A1 * 7/2010 Lin et al. ......................... 341/22
2012/0012466 A1 * 1/2012 Sperry et al. .................. 205/334
2012/0018289 A1 * 1/2012 Hwa ............................. 200/5 A
2012/0055771 A1 * 3/2012 Lin ............................... 200/314

* cited by examiner

*Primary Examiner* — Lam T Mai

(74) *Attorney, Agent, or Firm* — WPAT, PC; Justin King

(57) ABSTRACT

A light-emitting keyboard is disclosed, which comprises: a light guide plate, configured with a light entrance surface, a light emitting surface and a via hole; a light source, disposed next to the light entrance surface of the light guide plate; a frame, disposed on the light emitting surface of the light guide plate; an opaque material disposed on the via hole. With the aforesaid structure, light from the light source can be prevented from being emitting out from the via hole and thus can be evenly emitted out of the light guide plate.

10 Claims, 16 Drawing Sheets

310

500

LIGHT-EMITTING KEYBOARD

FIELD OF THE INVENTION

The present invention relates to a keyboard, and more particularly, to a light-emitting keyboard.

BACKGROUND OF THE INVENTION

Keyboard, being the most common input interface available on the market, is vastly used in many electric devices, such as computers, person digital assistances, cellular phones, and so on. With the advance of technology, keyboard that can emit light are gradually becoming the mainstream product of keyboard manufacturing industry since it is well adapted to be used in an environment that is not so well illuminated. Such light-emitting keyboards are especially suitable to be applied in notebook computers as the notebook computer, being designed to be carried around and used in all kinds of environments possible, that are equipped with light-emitting keyboards can operate easily under any illumination conditions. In addition, for meeting the growing personalization requirements of today's consumers, light-emitting keyboards can be designed with a hint of amusement for enabling the same to operate with dashing visual effects.

Please refer to FIG. 1A and FIG. 1B, which is a cross sectional view of a conventional light-emitting keyboard. As shown in FIG. 1A and FIG. 1B, the conventional light-emitting keyboard 100 is comprised of: a light guide plate 110, a light emitting diode (LED) 120 and a frame 130, in which the light guide plate 110 is configured with a light entrance surface 112 and a light emitting surface 114 whereas the light emitting surface 114 is constructed next to the light entrance surface 112; and the LED 120 is disposed at a position next to the light entrance surface 112 while the frame 130 is disposed on the light emitting surface 114 of the light guide plate 110.

Moreover, for discharging any liquid accidentally permeating into the light-emitting keyboard 100, there is a via hole 116 formed on the light guide plate 110 that is provided for guiding the liquid to flow out of the light emitting keyboard 100 therefrom. With the aforesaid structure, light emitted from the LED 120 will enter the light guide plate 110 through the light entrance surface 112 and leave the same through the light emitting surface 114 and then enter the frame 130 for enabling the frame to radiate light.

Generally, by properly arranging a plurality of reflection points on the light guide plate 110, the frame will be enabled to radiate light evenly. However, it is certain that there will be a portion of light passing through the via hole 116 and thus entering into the frame 130 which is going to cause the area of the frame 130 that is located corresponding to the via hole 116 to be brighter than other areas. Therefore, the brightness of the frame 130 is not evenly distributed. As it is obvious to users that the area of the frame 130 located corresponding to the via hole 116 is brighter, it is easy to raise a question regarding to the quality of the light-emitting keyboard 100.

Moreover, being one of the components used in notebook computers, the light-emitting keyboard 100 is usually being received inside the housing of the notebook computer while coupled to the monitor of the same. Therefore, if the monitor is being received inside a black or dark colored casing, or simply the housing of the notebook computer is black or dark colored, the portion of the frame 130 of the light-emitting keyboard that is neighboring to the monitoring casing will appear to be much brighter. Such huge brightness difference is going to cause incompatibility between the light-emitting keyboard 100 and the computer housing that is not aesthetically pleasing.

Please refer to FIG. 2A and FIG. 2B, which is a cross sectional view of another conventional light-emitting keyboard. As shown in FIG. 2A and FIG. 2B, the conventional light-emitting keyboard 200 is comprised of: a light guide plate 110, two light emitting diodes 220*a*, 220*b* and a frame 230, in which the light guide plate 210 is configured with two light entrance surfaces 212*a*, 212*b* and a light emitting surface 214 whereas the light emitting surface 214 is constructed next to the two light entrance surfaces 212*a*, 212*b*; and the two LEDs 220*a*, 22*b* are disposed at positions respectively corresponding to the two light entrance surfaces 212*a*, 212*b* while the frame 130 is disposed on the light emitting surface 214.

It is noted that the two LEDs 220*a*, 220*b* are designed to emit two beams of different colors, and correspondingly, the light emitting surface 214 of the light guide plate 210 is divided into a first light-emitting zone 214*a* and a second light-emitting zone 214*b* for emitting the two beams in respective. Thereby, the portion of the frame 230 corresponding to the first light-emitting zone 214*a* will display a lighting/coloring effect different from that of the portion of the frame 230 corresponding to the second light-emitting zone 214*b*.

However, it is inevitably that a mixing-light effect will be caused at the interface between the first light-emitting zone 214*a* and the second light-emitting zone 214*b*. Accordingly, the boundary separating the two light-emitting zones 214*a* and 214*b* is not apparent or even appears to be smeared that it is easy to raise a question regarding to the quality of the light-emitting keyboard 200.

Please refer to FIG. 2C, which is a cross sectional view of yet another conventional light-emitting keyboard. In the embodiment shown in FIG. 2C, the light-emitting keyboard 200*a* is constructed similar to that shown in FIG. 2A, but is different in that: the light-emitting keyboard 200*a* is further configured with a shielding layer 240 at a position between the light-emitting surface 214 of the light guide plate 210 and the frame 230. It is noted that the shielding layer 240 can be a transparent film being divided into a plurality of blocks of different colors. In this embodiment, the shielding layer 240 is divided into a first shielding zone 240*a* and a second shielding zone 240*b* while enabling the two shielding zones 240*a*, 240*b* to be located respectively at positions corresponding to the first and the second light-emitting zones 214*a*, 214*b*. Moreover, as the two LEDs 220*a* and 220*b* are white light LEDs, and the first and the second shielding zones 240*a*, 240*b* are coated with inks of different colors for allowing only lights of corresponding colors to pass therethrough in respective, the portion of the frame 230 corresponding to the first light-emitting zone 214*a* will display a lighting/coloring effect different from that of the portion of the frame 230 corresponding to the second light-emitting zone 214*b*. However, it is also inevitably that a mixing-light effect will be caused at the interface between the first light-emitting zone 214*a* and the second light-emitting zone 214*b*. Accordingly, the boundary separating the two light-emitting zones 214*a* and 214*b* is not apparent or even appears to be smeared that it is easy to raise a question regarding to the quality of the light-emitting keyboard 200*a*.

SUMMARY OF THE INVENTION

In view of the disadvantages of prior art, the object of the present invention is to provide a light-emitting keyboard capable of preventing a bright spot being generated in its frame at a position corresponding to a via hole in the keyboard.

Another object of the invention is to provide a light-emitting keyboard with an ability to produce large contrast differences between different areas of the keyboard, especially, at the interfaces between areas of different colors in the keyboard.

To achieve the above objects, the present invention provides a light-emitting keyboard, comprising: a light guide plate, configured with a light entrance surface, a light emitting surface and a via hole; a light source, disposed next to the light entrance surface of the light guide plate; a frame, disposed on the light emitting surface of the light guide plate; and an opaque material, disposed on the via hole; wherein the light entrance surface is disposed next and connecting to the light emitting surface.

Moreover, to achieve the above objects, the present invention provides another light-emitting keyboard, comprising: a light guide plate, configured with a light entrance surface, a light emitting surface in a manner that the light emitting surface, being composed of a first light-emitting zone and a second light-emitting zone, is disposed next and connecting to the light entrance surface; a light source, disposed next to the light entrance surface of the light guide plate; a frame, disposed on the light emitting surface of the light guide plate; and a light absorbing material, disposed on the light emitting surface at a position corresponding to the interface between the first light-emitting zone and the second light-emitting zone.

In an embodiment, the light-emitting keyboard of the invention further comprises: a shielding layer, disposed at a position between the light-emitting surface of the light guide plate and the frame. It is noted that the shielding layer can be a transparent film having a portion thereof being printed with light-shielding inks. Moreover, the shielding layer can be divided into a first shielding zone and a second shielding zone while enabling the two shielding zones to be located respectively at positions corresponding to the first and the second light-emitting zones.

In an embodiment, the light guide plate is configured with a bottom surface and a plurality of reflection points in a manner that the plural reflection points are disposed on the bottom surface while enabling the bottom surface to be arranged opposite to the light-emitting surface.

In an embodiment, the light source can be a light-emitting diode (LED); and the opaque material can be a black ink or aluminum; and the light absorbing material can be a kind of ink.

To sum up, by disposing an opaque material at a position corresponding to the via hole, the light-emitting keyboard of the invention is able to radiate light evenly since it can prevent light from being emitting out from the via hole and enable the light guide plate to radiate light evenly. In addition, by arranging a light absorbing material at a specific area of the light guide plate's light-emitting surface, the contrast difference between the first light-emitting zone and the second light-emitting zone is enlarged so that the adverse affect of the mixing-light effect can be reduced.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 4C is a three dimensional view of the light-emitting keyboard shown in

FIG. 4B without the light source.

FIG. 5C is a three dimensional view of the light-emitting keyboard shown in

FIG. 4B without the light source.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1A:
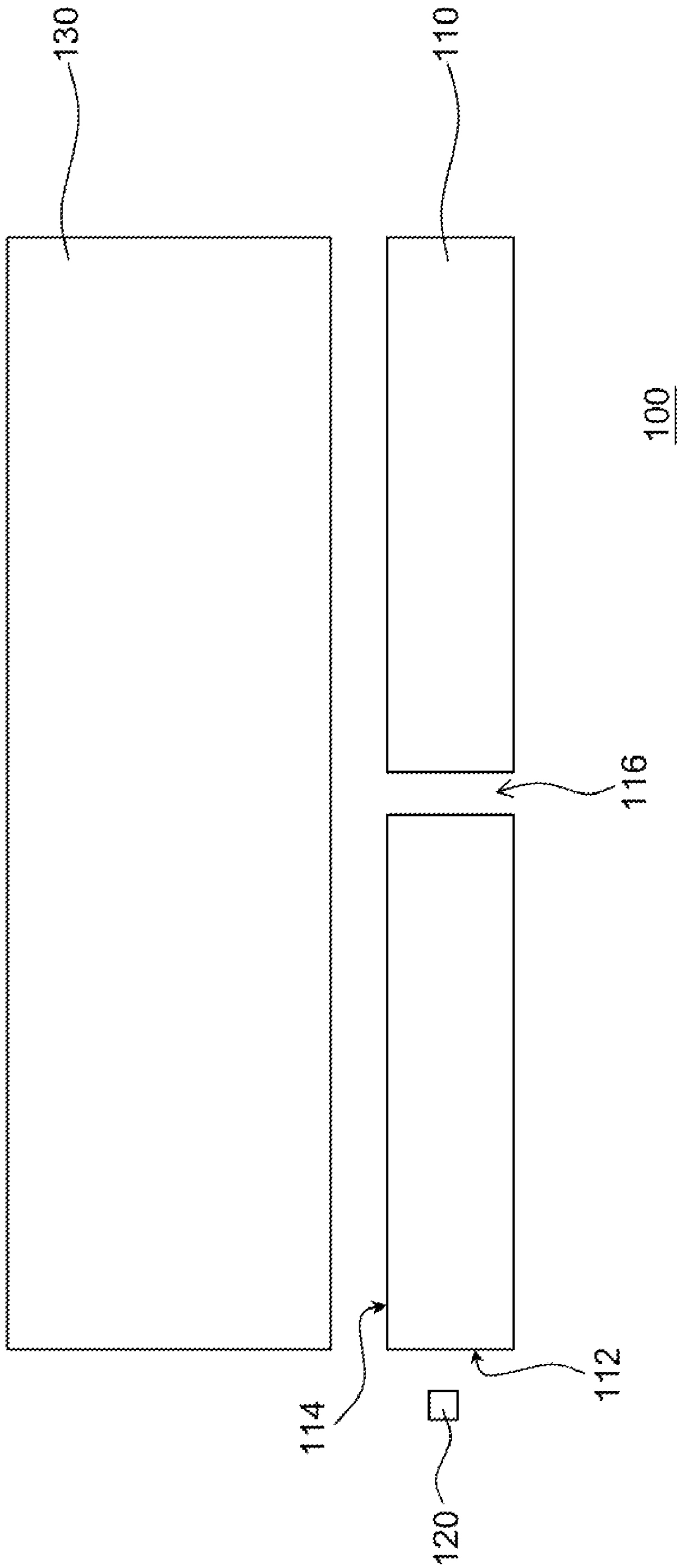
FIG.1A (Prior Art)
FIG. 1A is a cross sectional view of a conventional light-emitting keyboard.
Figure 1B:
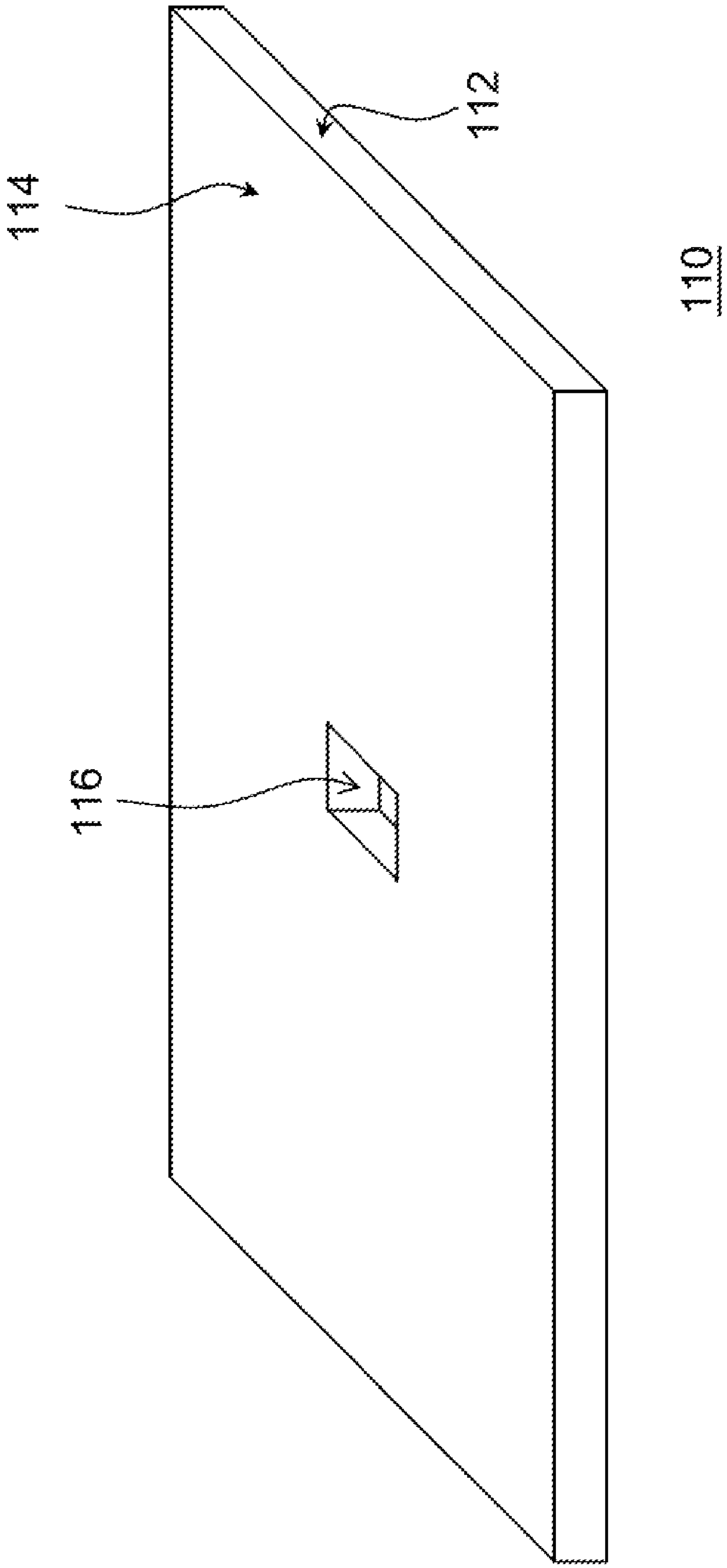
FIG. 1B (Prior Art)
FIG. 1B is a three dimensional view of the conventional light-emitting keyboard of FIG. 1A.
Figure 2A:
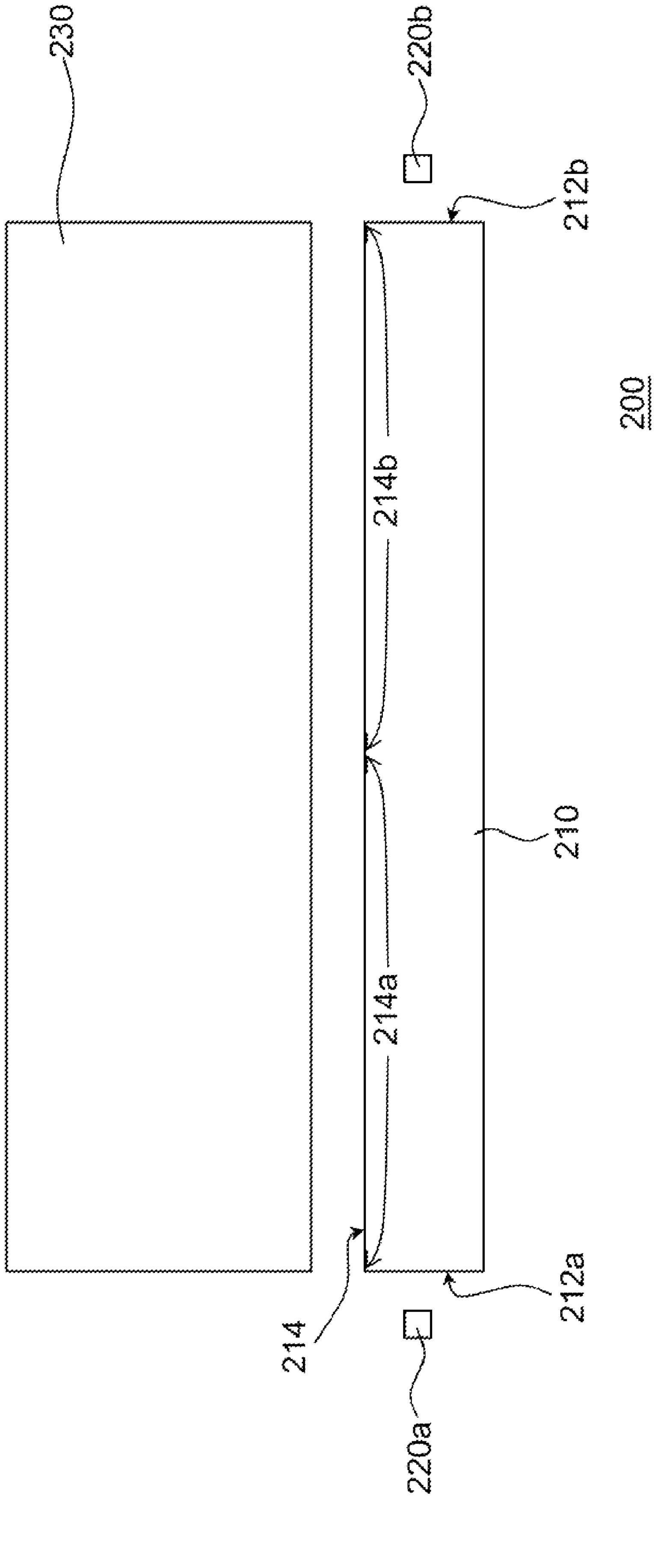
FIG.2A (Prior Art)
FIG. 2A is a cross sectional view of another conventional light-emitting keyboard.
Figure 2B:
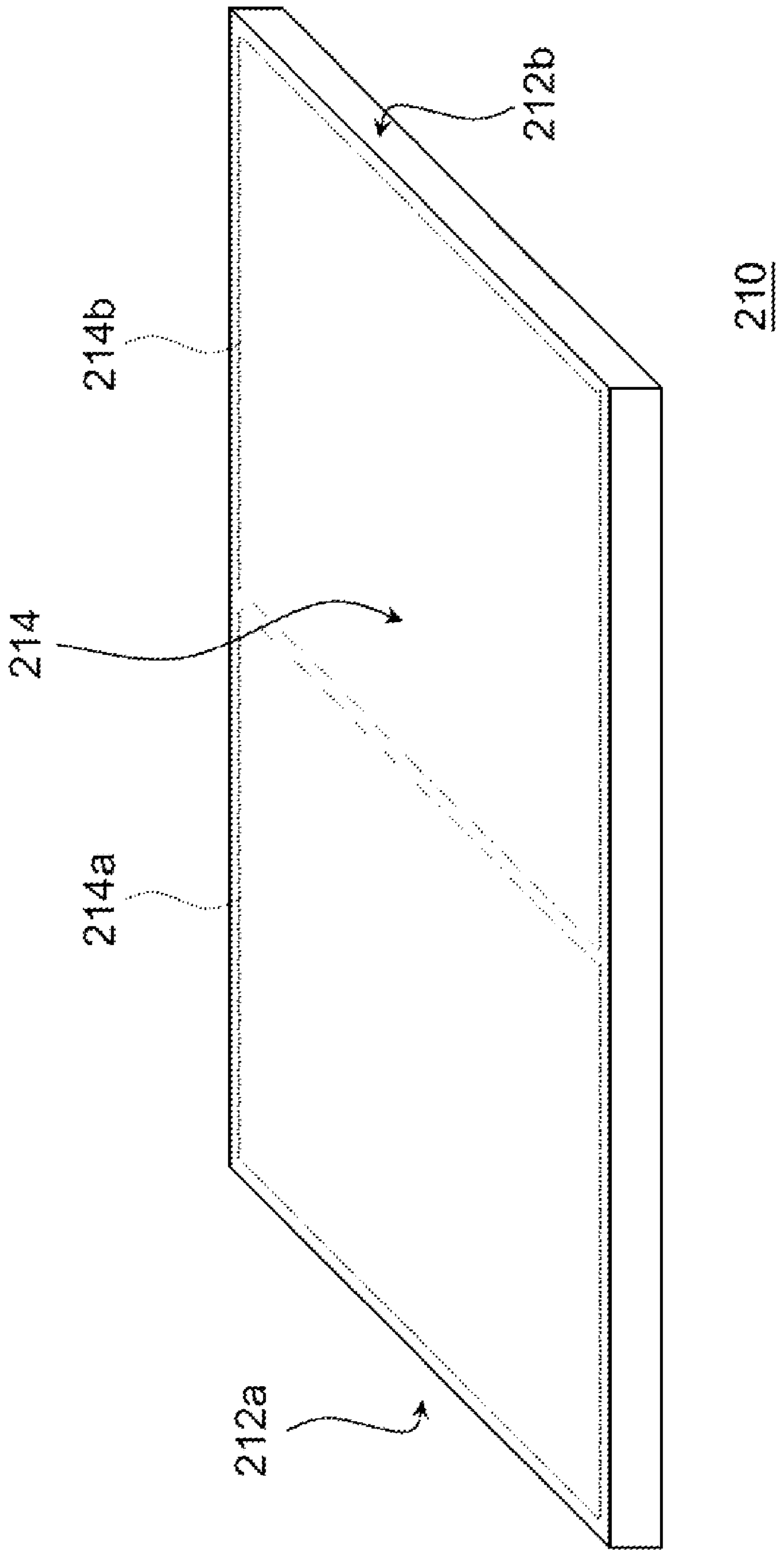
FIG.2B (Prior Art)
FIG. 2B is a three dimensional view of the conventional light-emitting keyboard of FIG. 2A.
Figure 2C:
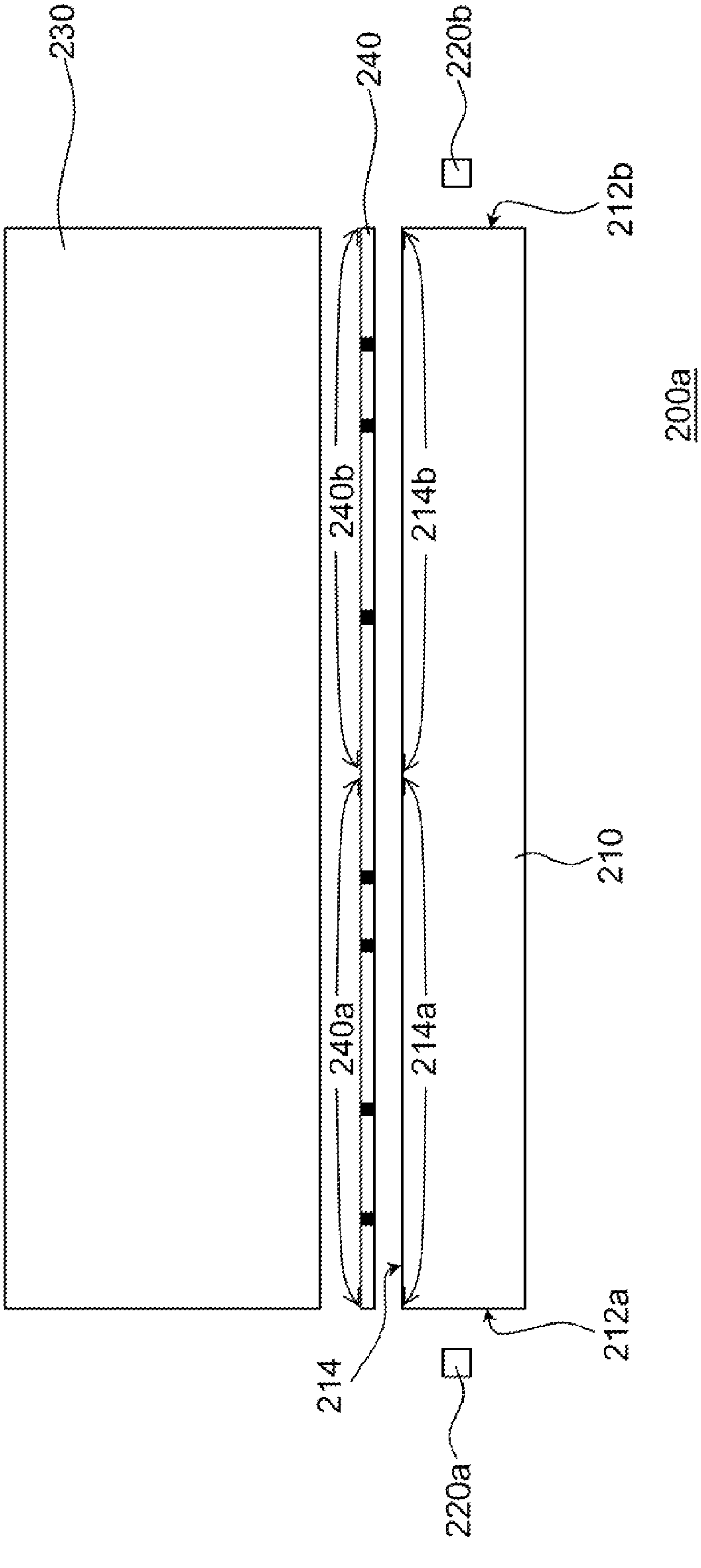
FIG.2C (Prior Art)
FIG. 2C is a cross sectional view of yet another conventional light-emitting keyboard.
Figure 3A:
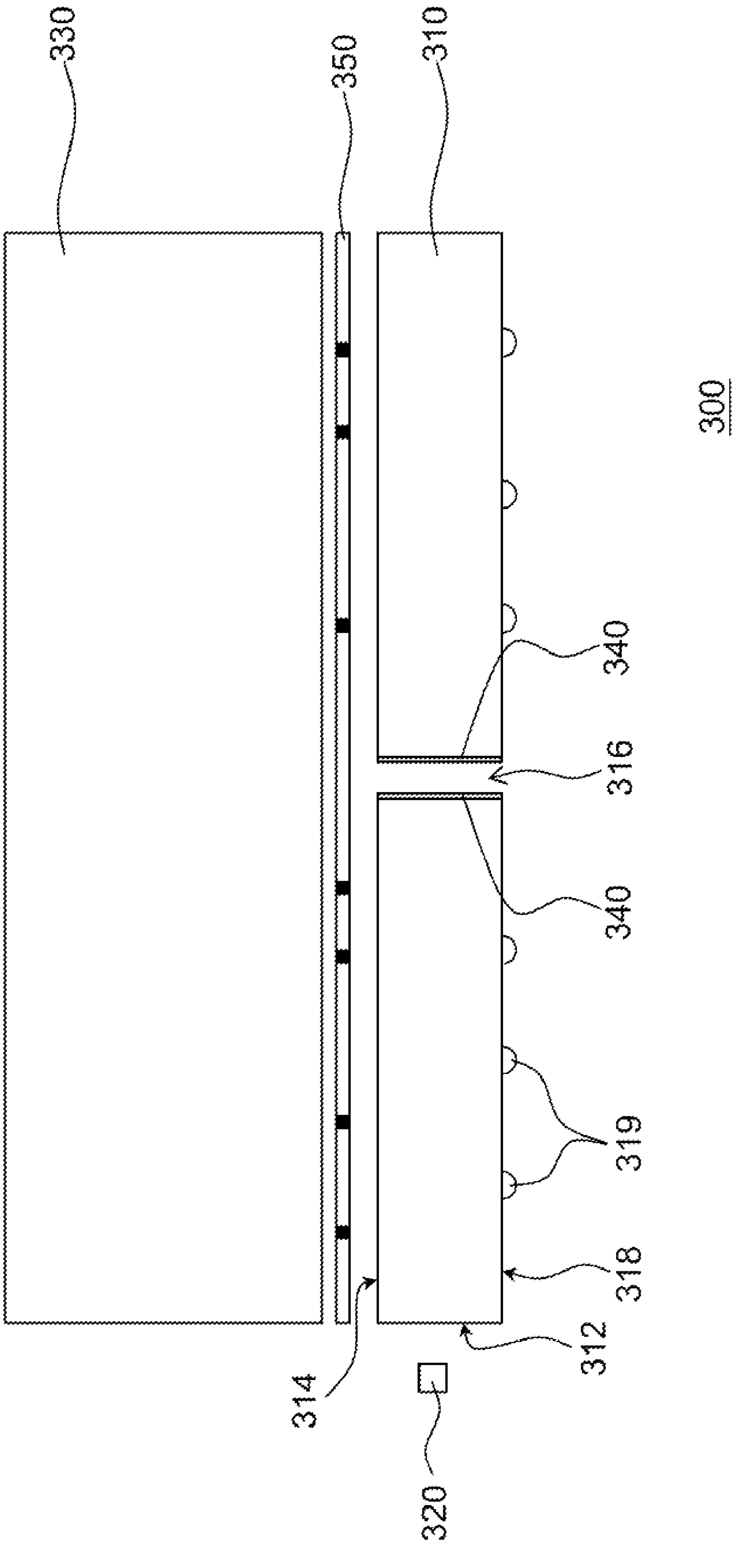
FIG. 3A is a cross sectional view of a light-emitting keyboard according to a first embodiment of the invention.
Figure 3B:
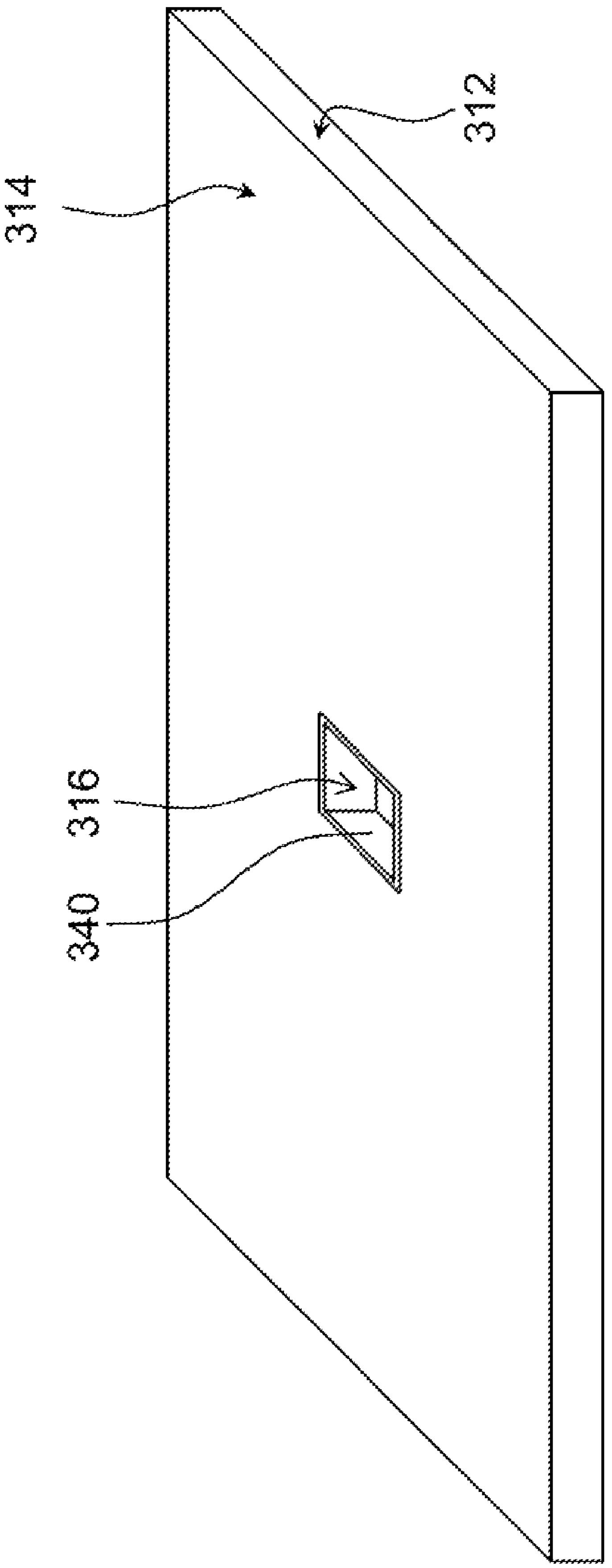
FIG. 3B is a three dimensional view of the light-emitting keyboard of FIG. 3A.

Please refer to FIG. 3A and FIG. 3B, which shows a light-emitting keyboard according to an embodiment of the invention. As shown in FIG. 3A and FIG. 3B, the light-emitting keyboard 300 comprises: a light guide plate 310, a light source 320, a frame 330 and an opaque material 340, in which the light guide plate 310 is configured with a light entrance surface 312 and a light emitting surface 314 in a manner that the light emitting surface 314 is arranged next and connecting to the light entrance surface 312; and the light source 320 is disposed next to the light entrance surface 312 of the light guide plate 310 while arranging the frame 330 on the light emitting surface 314. In addition, the light guide plate 310 is further configured with a via hole 316 that is provided for guiding the liquid accidentally flowing into the interior of the light-emitting keyboard 300 to flow out of the same therefrom, whereas the exit of the via hole 316 is located at the light emitting surface 314. Moreover, the opaque material 340, being a black ink in this embodiment for instance, can be arranged at a position corresponding to the via hole 316.

In this embodiment, the light source, being a light emitting diode (LED), is enabled to project light toward the light entrance surface 312, from which it enters into the light guide plate 310 to be guided out of the same from the light emitting surface 314 and then into the frame 330 so that the frame 330 is enabled to radiate accordingly.

As the opaque material 340 is arranged at a position corresponding to the via hole 316, the light entering into the via hole 316 will be blocked from traveling into the frame 330, and thus, the area of the frame 330 that is located corresponding to the via hole 316 will not be brighter than other areas. Therefore, the brightness of the frame 330 is evenly distributed.

Figure 3C:
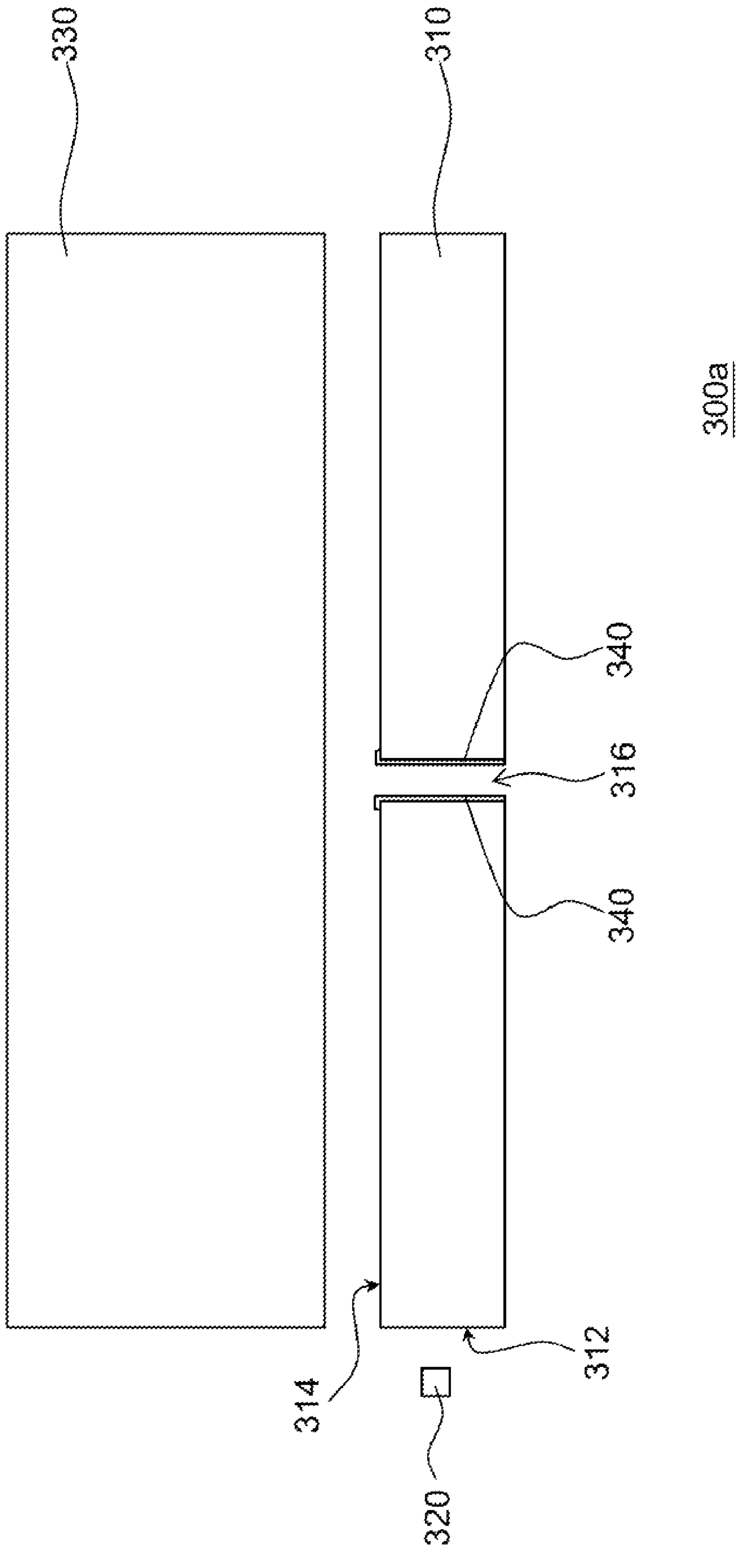
FIG. 3C is a cross sectional view of a light-emitting keyboard according to a second embodiment of the invention.

However, if the area of the frame 330 that is located corresponding to the via hole 316 is still brighter, it is preferred to coat the opaque material all over the light emitting surface 314 at the neighboring areas corresponding to the via hole 316, as the light-emitting keyboard 300*a* shown in FIG. 3C, by that the brightness resulting from the light passing from the via hole 316 can be reduced. It is known to those skilled in the art that the aforesaid arrangement relating to the opaque material can bed modified to include variations in size, materials, shape, form, function and manner of operation, assembly and use, which are intended to be encompassed by the present invention.

It is noted that the aforesaid opaque material 340 is not limited to be a black ink as disclosed in the foregoing embodiment. For instance, the opaque material can be a material of high reflective index, such as aluminum, by that the light from the via hole 316 will be reflected back into the light guide plate 310 and thus the usage efficiency of the light source 320 can be enhanced.

In the embodiment shown in FIG. 3A and FIG. 3B, the light-emitting keyboard 300 further comprises: a shielding layer 350, which is disposed at a position between the light emitting surface 314 of the light guide plate 310 and the frame 330. It is noted that shielding layer 350 is a transparent thin film having a portion thereof being printed with light-shielding inks, in which the portion of the light shielding inks including a plurality of areas of the thin film that are located corresponding to the keycap profiles defined on the frame 330, so that the contrasts relating to the keycap profiles can be enhanced for facilitating the same to be identified by users.

In addition, the light guide plate 310 is further configured with a bottom surface 318 while enabling the same to be arranged opposite to the light emitting surface 314. In order to enable light from the light source 320 to be projected out of the light emitting surface 314 of the light guide plate 310 more evenly, the light guide plate 310 is further being configured with a plurality of reflection points 319 at the bottom surface 318 thereof. When the light traveling inside the light guide plate 310 comes into contact with those reflection points 319, it will be guide to the light emitting surface 314 by the breaking down of total reflection and thus being discharge out of the light guide plate 310. By the proper reflection point design relating to location and density, the uniformity of light being emitted out of the light guide plate can further be improved.

Figure 4A:
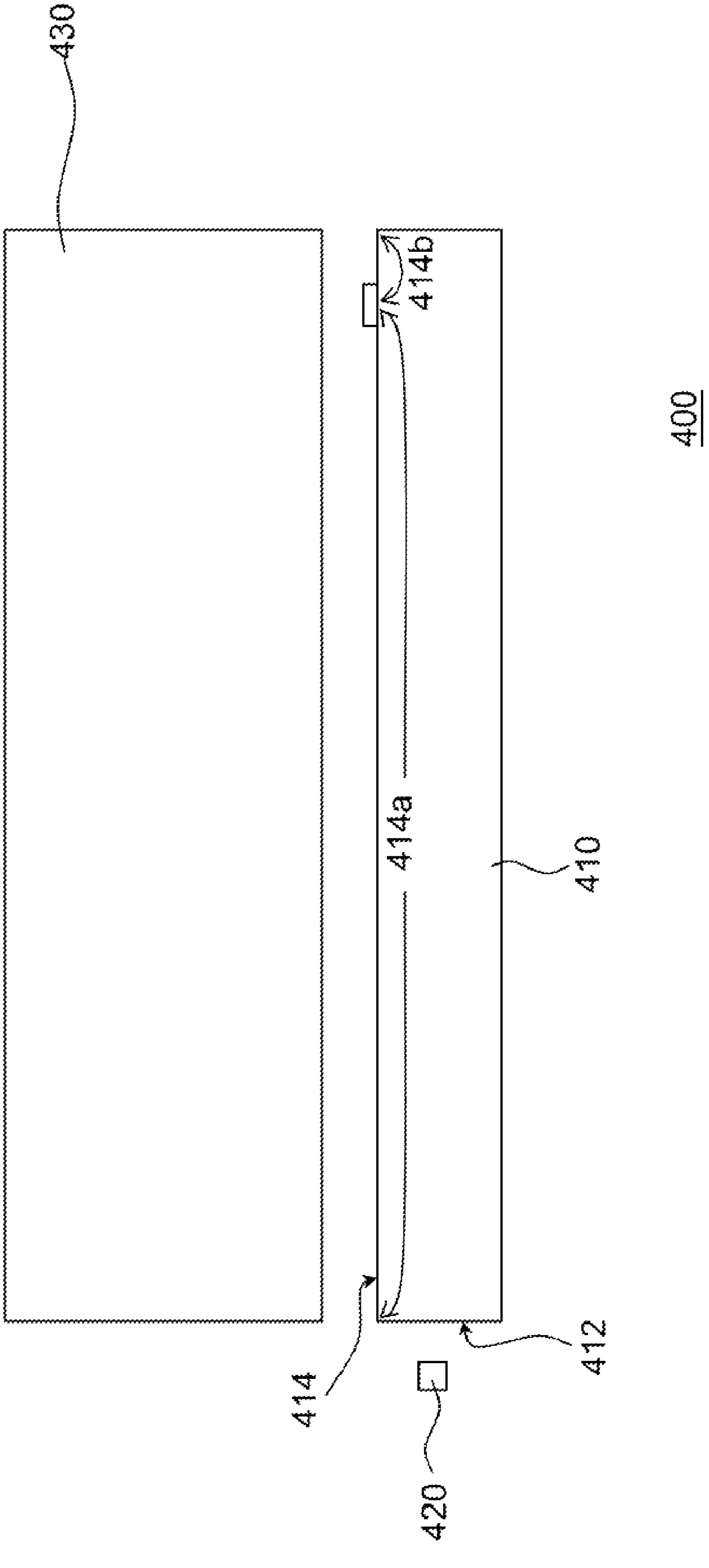
FIG. 4A is a cross sectional view of a light-emitting keyboard according to a third embodiment of the invention.
Figure 4B:
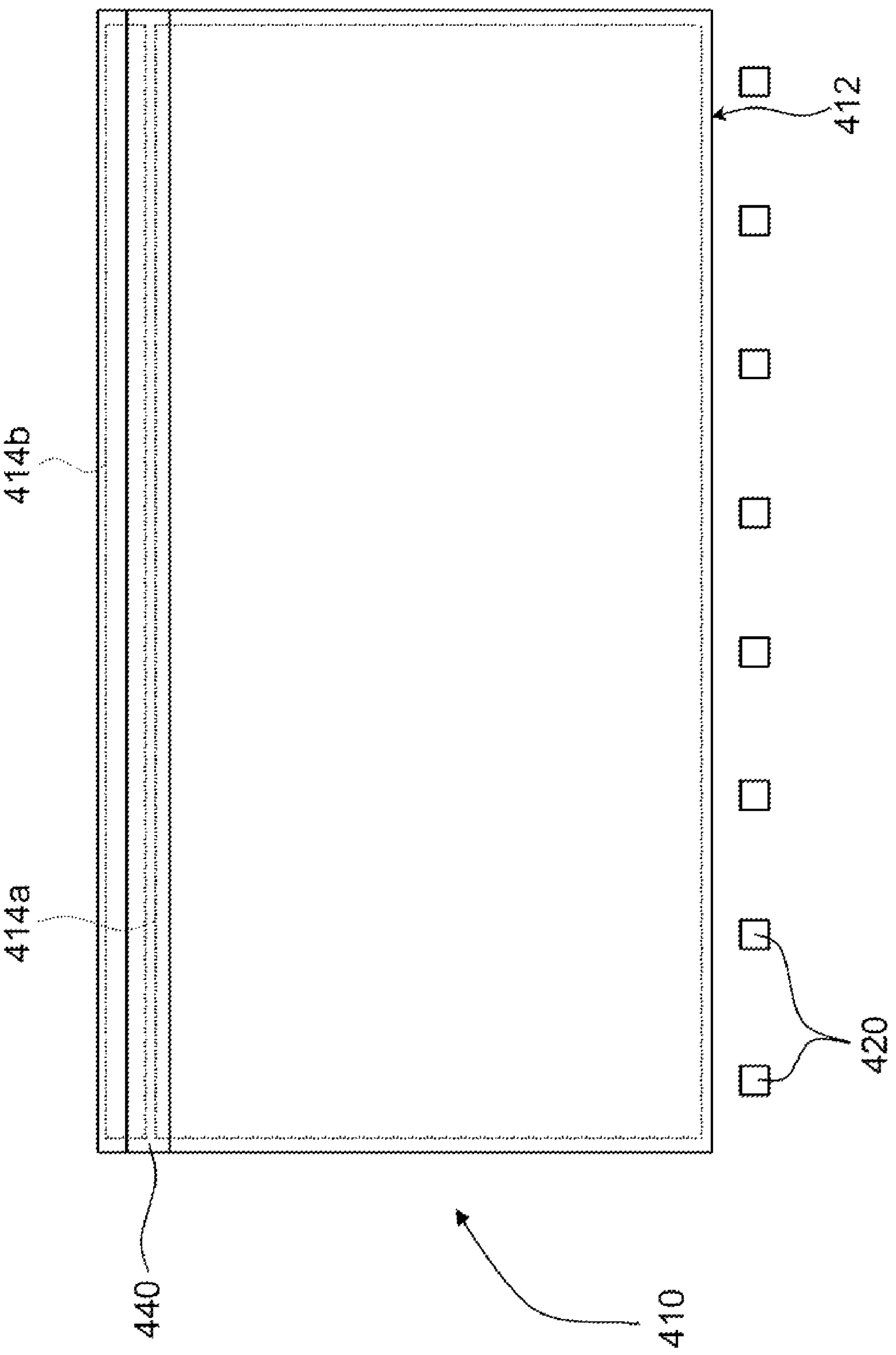
FIG. 4B is a top view of the light-emitting keyboard shown in FIG. 4A without the frame.
Figure 4C:
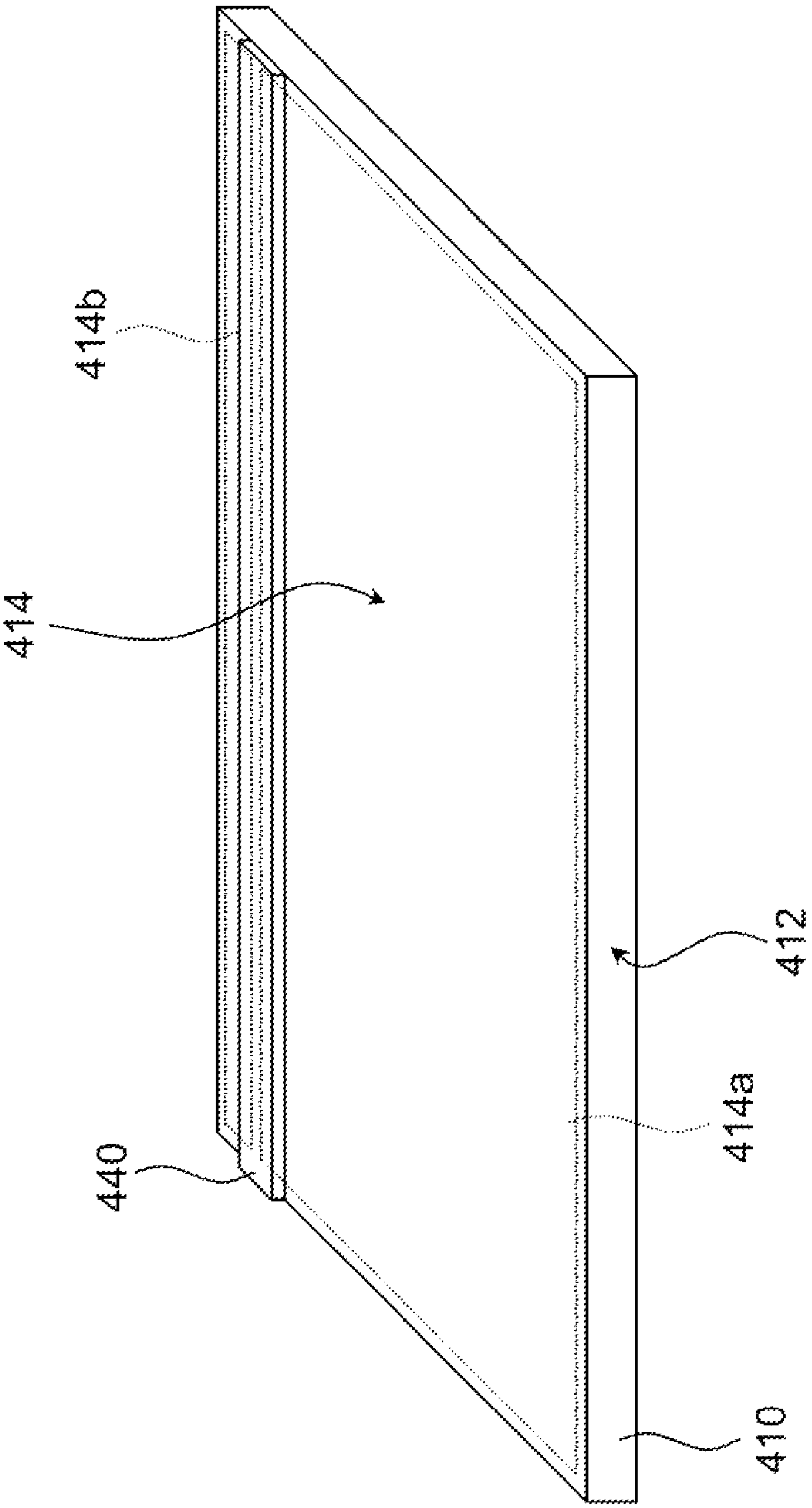

FIG. 4A is a cross sectional view of a light-emitting keyboard according to a third embodiment of the invention. FIG. 4B is a top view of the light-emitting keyboard shown in FIG. 4A without the frame. FIG. 4C is a three dimensional view of the light-emitting keyboard shown in FIG. 4B without the light source. In the embodiment shown in FIG. 4A~FIG. 4C, the light-emitting keyboard 400 comprises: a light guide plate 410, a light source 420, a frame 430 and a light absorbing material 440, in which the light guide plate 410 is configured with a light entrance surface 412 and a light emitting surface 414 in a manner that the light emitting surface 414 is arranged next and connecting to the light entrance surface 412; and the light source 420 is disposed next to the light entrance surface 412 of the light guide plate 410 while arranging the frame 430 on the light emitting surface 414.

As shown in FIG. 4A, the light emitting surface 414 is divided into a first light-emitting zone 414*a* and a second light-emitting zone 414*b*, in which the second light-emitting zone 414*b* is a long narrow area located opposite to the light source 420 at a position neighboring to other dark-colored electric components, such as the aforesaid monitor or housing in the aforesaid conventional keyboard. In addition, the light absorbing material 440 is disposed on the light emitting surface 414 at a position corresponding to the interface between the first light-emitting zone 414*a* and the second light-emitting zone 414*b*. In this embodiment, the light absorbing material 440 is a kind of black ink.

As the second light-emitting zone 414*b* is a long narrow area that has a portion thereof being shielded by the light absorbing material 440, the portion of light leaving the light guide plate 410 from its light emitting surface 414 that is corresponding to the second light-emitting zone 414*b* where it is shielded by the light absorbing material 440 will be absorbed, and thereby, the brightness of the second light-emitting zone 414*b* is reduced. Accordingly, the brightness is reduced gradually from the brightest first light-emitting zone 414*a* to the less brighter second light-emitting zone 414*b*, and finally to those dark electric components, so that the contrast difference is reduced and thus the aesthetic pleasing sensation is enhanced. In another word, by reducing the brightness of the second light-emitting zone 414*b* to be used as a buffer between the first light-emitting zone 414*a* and the electric components, the inconsistence between the light-emitting keyboard 400 and the those dark electric components can be eliminated for enhancing the integrality of the whole structure.

It is noted that the whole second light-emitting zone 414*b* can be covered completely by the light absorbing material 440 for further reducing the brightness of the second light-emitting zone 414*b*, as shown in other embodiments, which is dependent upon actual requirement. In addition, there is no limitation relating to the thickness of the light absorbing material 440. For instance, the thickness of the light absorbing material 440 can be formed increasing gradually from the first light-emitting zone 414*a* to the second light-emitting zone 414*b*, by that the brightness is reducing gradually accordingly. Moreover, there can also being reflection points and/or shielding layer being configured in the light-emitting keyboard of this embodiment, which is similar to the previous embodiment and thus will not be described herein.

It is noted that the characteristic of the present embodiment is that: by the arrangement of the light absorbing material at the interface between the two light-emitting zones, the contrast differences of the two is increased, which is especially suitable for a situation that the two light-emitting zones are designed to emitted lights of different colors as it can reduce the adverse affect of the mixing-light effect.

Figure 5A:
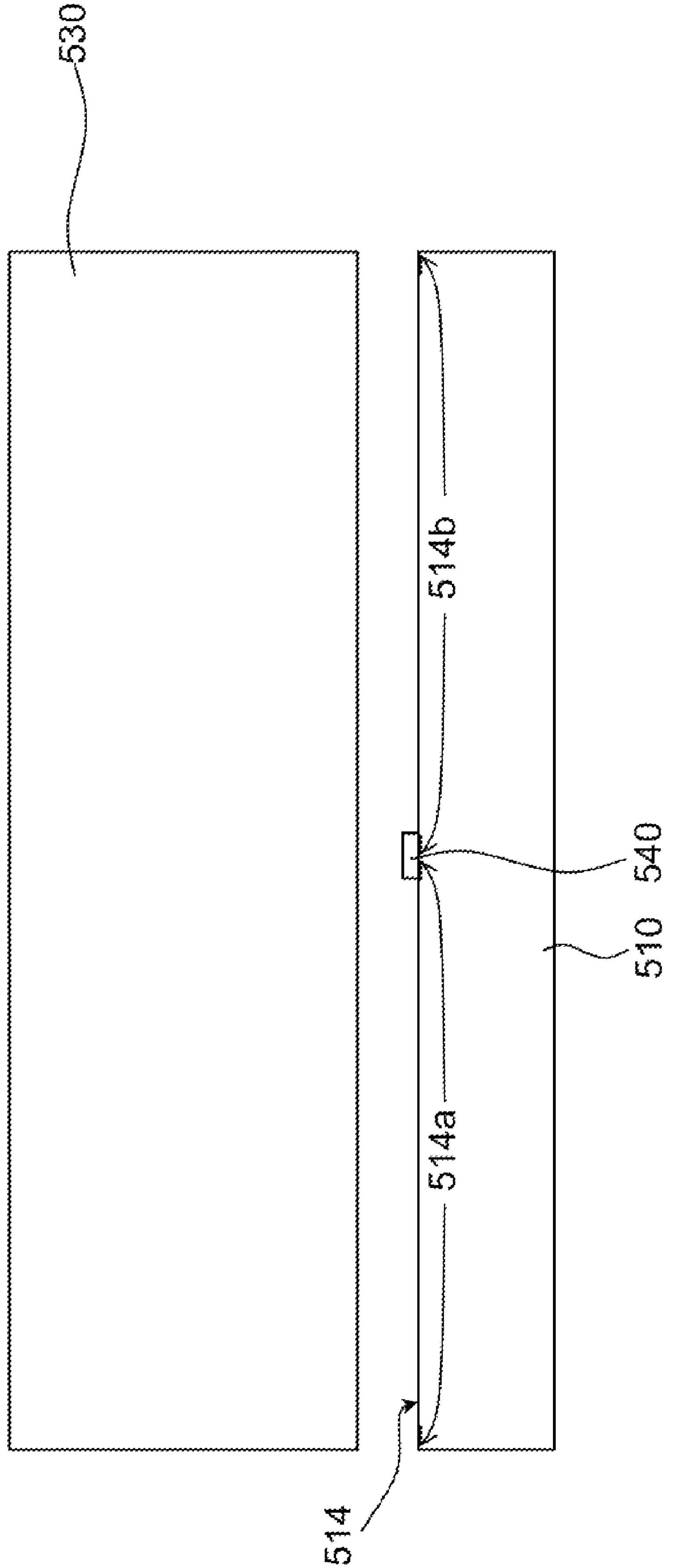
FIG. 5A is a cross sectional view of a light-emitting keyboard according to a fourth embodiment of the invention.
Figure 5B:
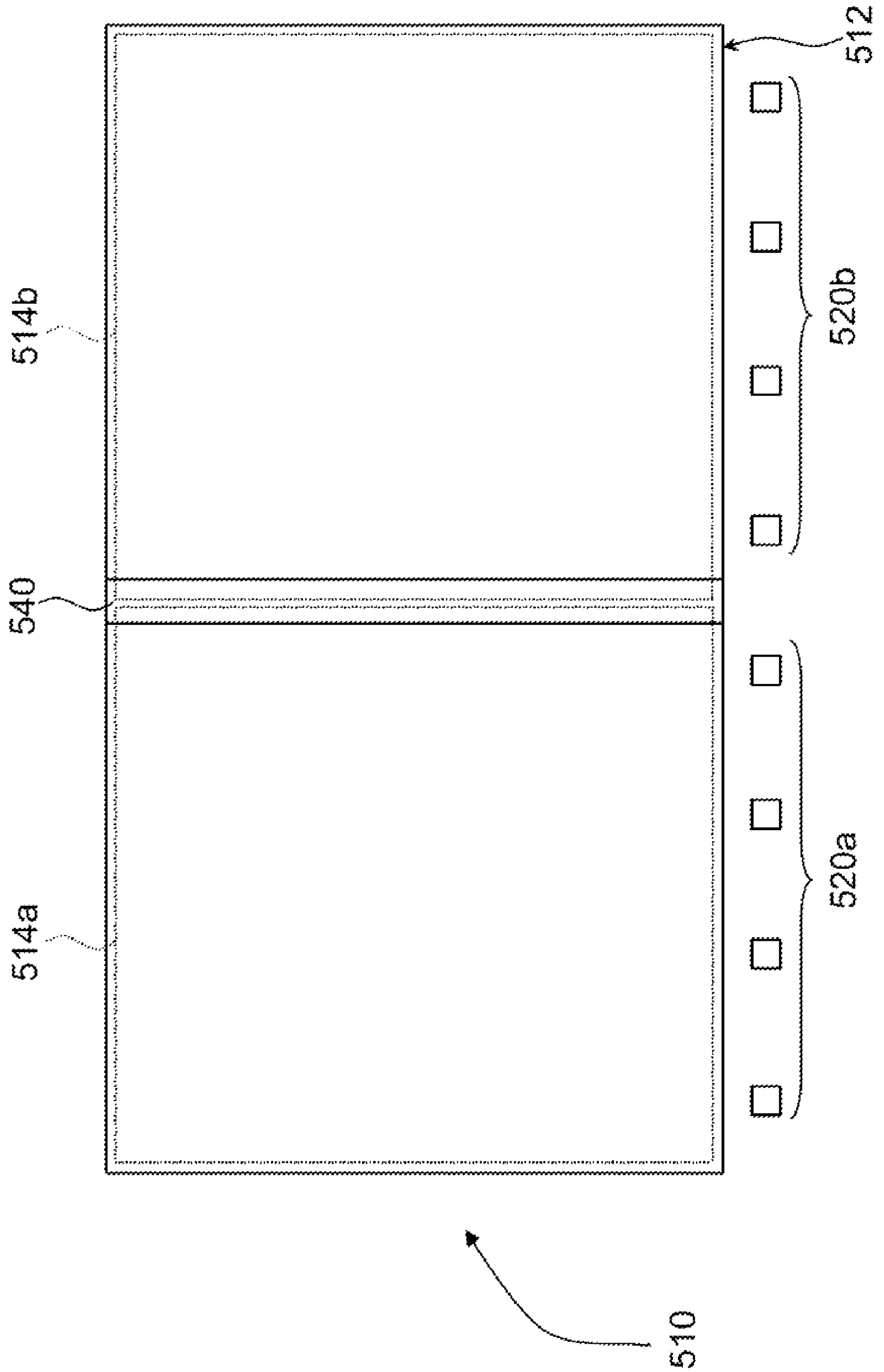
FIG. 5B is a top view of the light-emitting keyboard shown in FIG. 5A without the frame.

FIG. 5A is a cross sectional view of a light-emitting keyboard according to a third embodiment of the invention. FIG. 5B is a top view of the light-emitting keyboard shown in FIG.

Figure 5C:
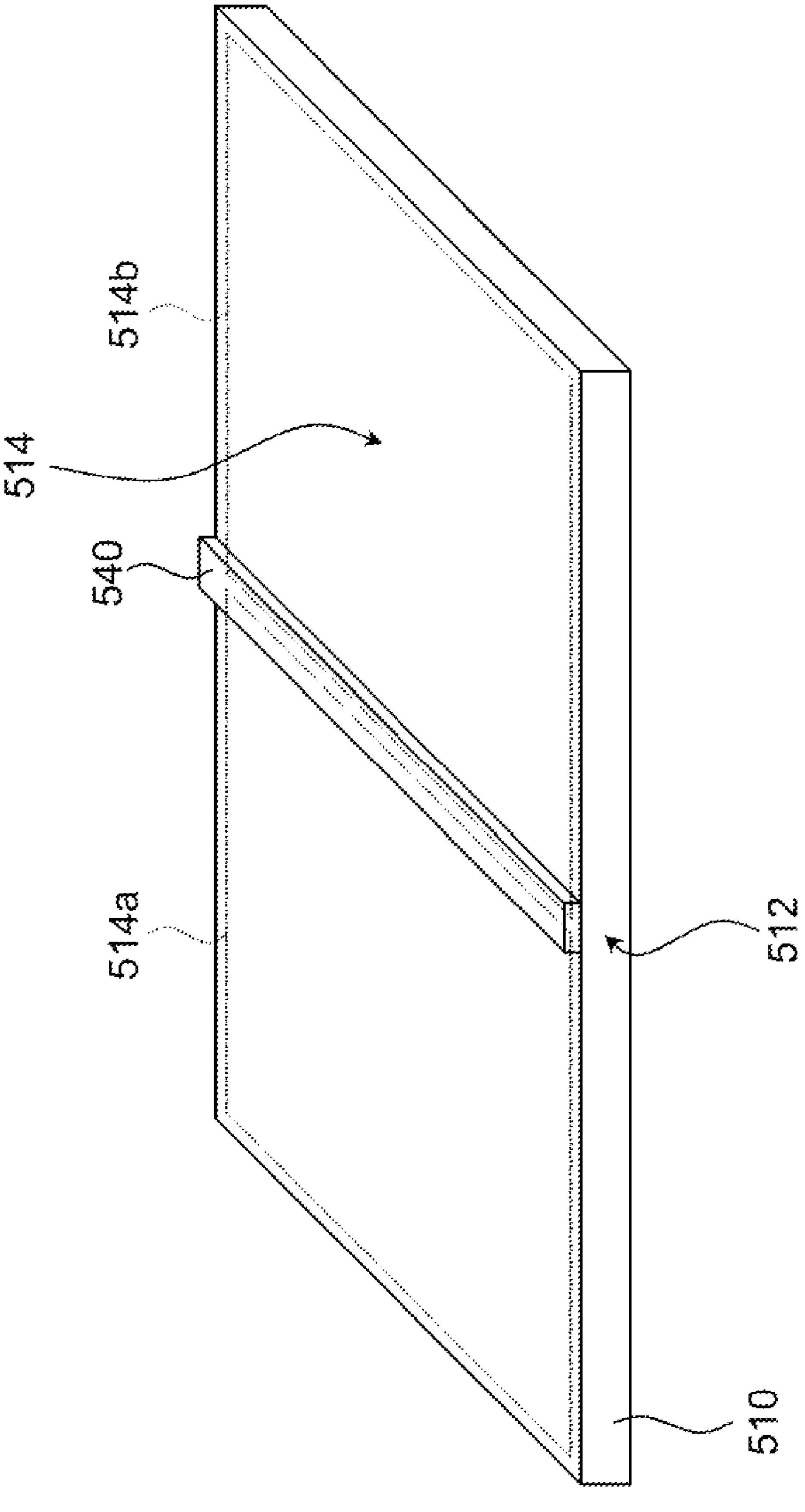

5A without the frame. FIG. 5C is a three dimensional view of the light-emitting keyboard shown in FIG. 5B without the light source. In the embodiment shown in FIG. 5A~FIG. 5C, the light-emitting keyboard 500 comprises: a light guide plate 510, two light sources 520*a*, 520*b*, a frame 530 and a light absorbing material 540, in which the light guide plate 510 is configured with a light entrance surface 512 and a light emitting surface 514 in a manner that the light emitting surface 514 is arranged next and connecting to the light entrance surface 512; and the two light sources 520*a*, 520*b* are disposed next to the light entrance surface 512 of the light guide plate 510 while arranging the frame 530 on the light emitting surface 514. In addition, the light emitting surface 514 is divided into a first light-emitting zone 514*a* and a second light-emitting zone 514*b*, and the light absorbing material 540 is disposed on the light emitting surface 514 at a position corresponding to the interface between the first light-emitting zone 514*a* and the second light-emitting zone 514*b*.

In this embodiment, the two light sources 520*a*, 520*b* are designed to emit lights of different colors so that the areas of the frame 530 that are corresponding to the first light-emitting zone 514*a* and the second light-emitting zone 514*b* in respective can radiate lights of different colors accordingly. Operationally, the portion of light leaving the light guide plate 510 from its light emitting surface 514 from the area corresponding to the interface of the first and the second light-emitting zones 514*a* and 514*b* where it is shielded by the light absorbing material 540 will be absorbed. Accordingly, the adverse affect of color mixing can be eliminated while the contrast differences on the frame 530 at areas corresponding to the interface between the first and the second light-emitting zones 514*a* and 514*b* will be increased. That is, when the light source 520*a* is a red LED and the other light source 520*b* is a blue LED, the areas in the frame 530 corresponding to the first light-emitting zone 514*a* will emit pure red light that is in high contrast against the blue light emitted from the areas in the frame 530 corresponding to the second light-emitting zone 514*b*, and the same time that there will be no purple light being emitted from the interface between the first and the second light-emitting zones 514*a* and 514*b* as the result of mixing light effect.

Figure 5D:
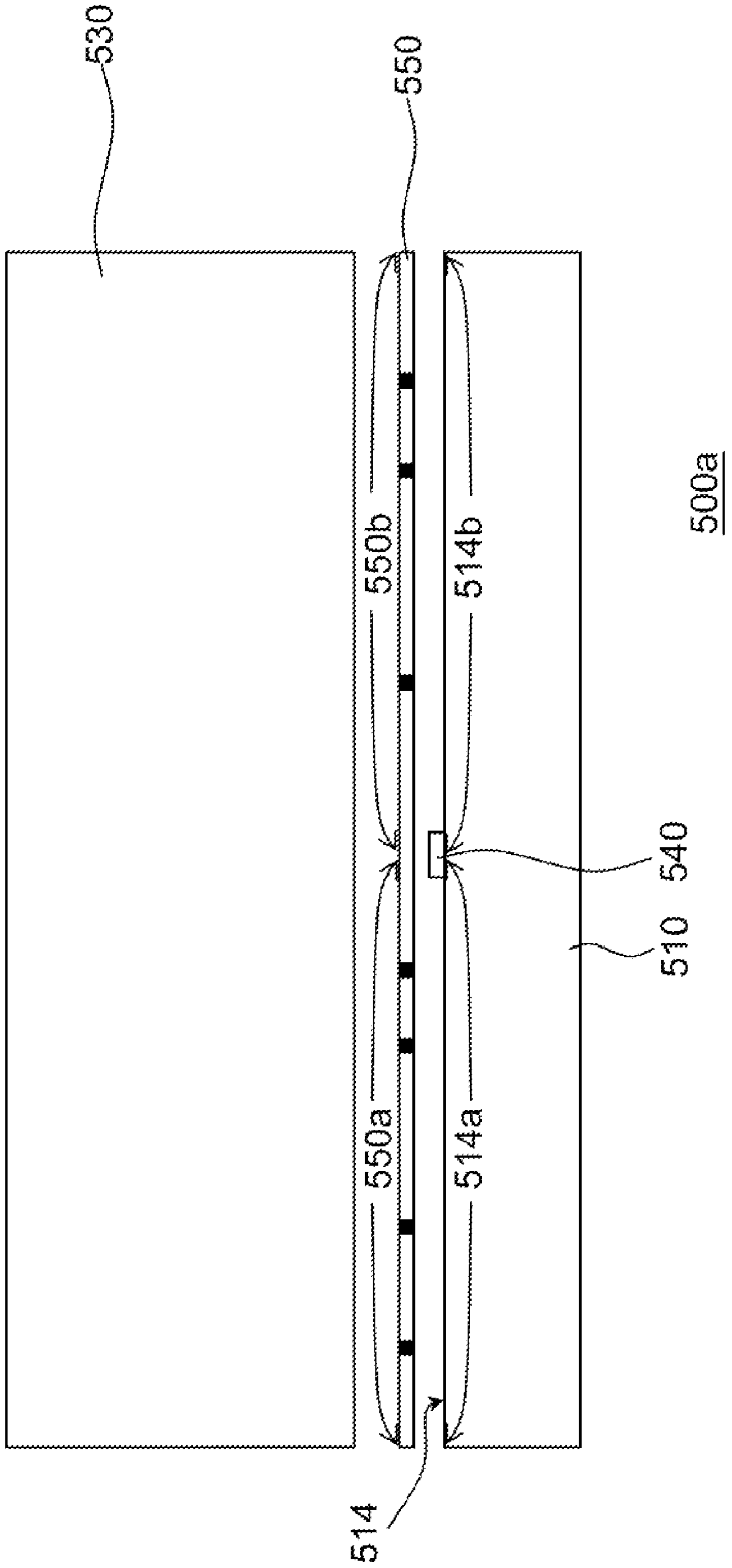
FIG. 5D is a cross sectional view of a light-emitting keyboard according to a fifth embodiment of the invention.

In an embodiment shown in FIG. 5D, the light-emitting keyboard 500*a* further comprises a shielding layer 550, which is disposed at a position between the light-emitting surface 514 of the light guide plate 510 and the frame 530. It is noted that shielding layer 550 is a transparent thin film having a portion thereof being printed with light-shielding inks, in which different areas in the portion are coated with the light-shielding inks of different colors. In this embodiment, the shielding layer is composed of a first shielding zone 550*a* and a second shielding zone 550*b* while enabling the two shielding zones 550*a* and 550*b* to be located respectively at positions corresponding to the first and the second light-emitting zones 514*a* and 514*b*. Although both the two light sources 520*a*, 520*b* are white light LEDs in this embodiment, the colors emitted from the first and the second light-emitting zones 514*a* and 514*b* are different from each other according to the different shielding effects resulting from the first shielding zone 550*a* and the second shielding zone 550*b* of different colors. Similarly, by the arrangement of the light absorbing material 540, the light mixing effect at the interface between the first and the second light-emitting zones 514*a* and 514*b* can be reduced.

Figure 5E:
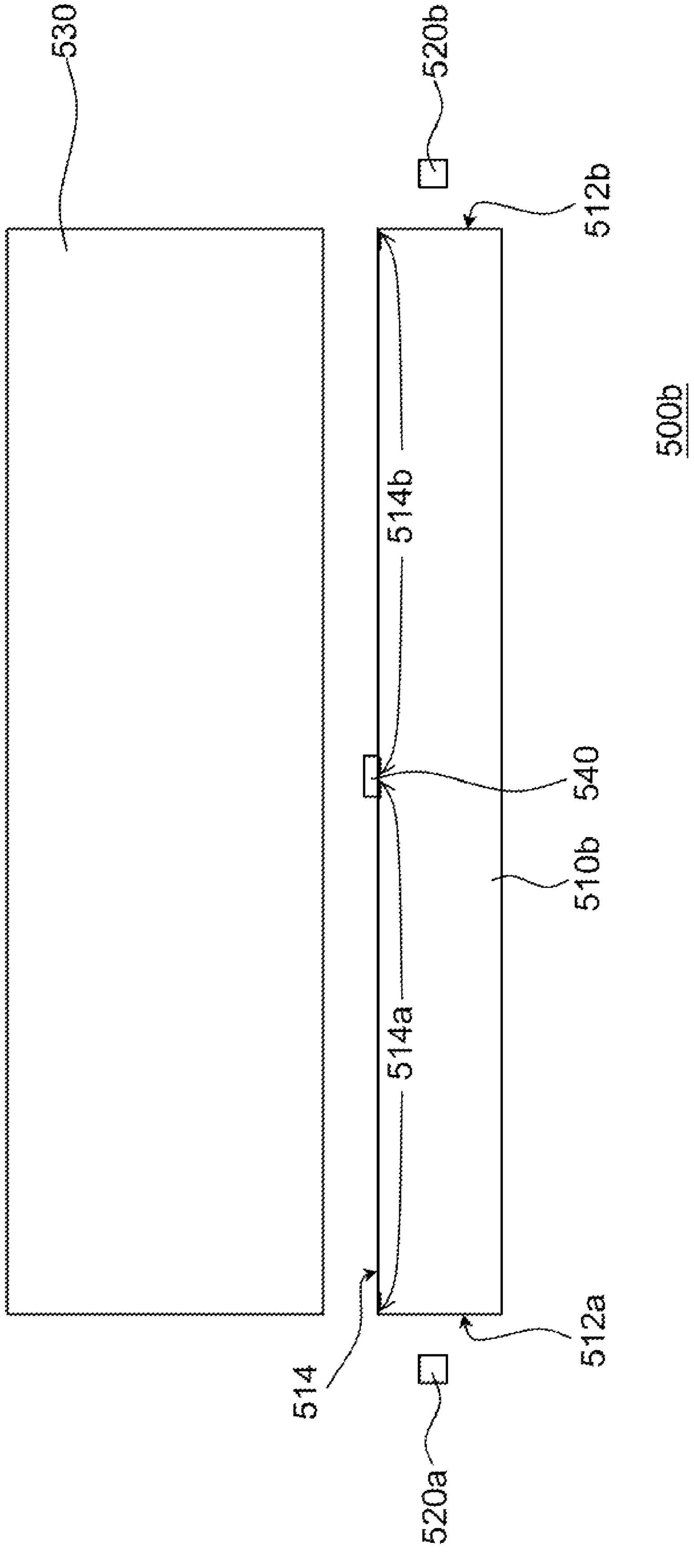
FIG. 5E is a cross sectional view of a light-emitting keyboard according to a sixth embodiment of the invention.

It is noted that there is no restriction regarding to the shape and size of the first and the second light-emitting zones 514*a* and 514*b*. Therefore, they can easily be defined in shape and size by those skilled in the art, or it is even possible to define more than three such light-emitting zones in another embodiments at will. In addition, as shown in the light-emitting keyboard 500*b* shown in FIG. 5E, the light guide plate 510*b* is configured with two opposite light entrance surfaces 512*a*, 512*b*, and thus the two light sources 520*a*, 520*b* are disposed respectively next to their corresponding light entrance surfaces 512*a*, 512*b* in respective.

To sum up, the light-emitting keyboard of the invention has the following advantages:

(1) By the opaque material disposed corresponding to the via hole, the light-emitting keyboard of the invention is able to radiate light evenly since it can prevent light from being emitting out from the via hole and enable the light guide plate to radiate light evenly.

(2) By the arrangement of the light absorbing material at a specific area on the light emitting surface of the light guide plate, the contrast different at the interface between the first and the second light-emitting zones of the light emitting surface is increased.

(3) By arranging the light absorbing material in a light-emitting keyboard designed for radiating multiple colors from different areas thereof, the adverse affect of light mixing can be greatly reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-emitting keyboard, comprising:

a light guide plate, configured with a light entrance surface, a light emitting surface and a via hole in a manner that the light entrance surface is disposed next and connecting to the light emitting surface;

a light source, disposed on light entrance surface of the light guide plate;

a frame, disposed on the light emitting surface of the light guide plate; and an opaque material, disposed at a position corresponding on the via hole.

2. The light-emitting keyboard of claim 1, further comprises:

a shielding layer, disposed at a position between the light-emitting surface of the light guide plate and the frame.

3. The light-emitting keyboard of claim 2, wherein the shielding layer is a transparent thin film having a portion thereof being printed with light-shielding inks.

4. The light-emitting keyboard of claim 1, wherein the light guide plate is configured with a bottom surface and a plurality of reflection points in a manner that the plural reflection points are disposed on the bottom surface while enabling the bottom surface to be arranged opposite to the light-emitting surface.

5. The light-emitting keyboard of claim 1, wherein the opaque material is a material selected from the group consisting of: a black ink and aluminum.

6. A light-emitting keyboard, comprising:

a light guide plate, configured with a light entrance surface, a light emitting surface in a manner that the light emitting surface, being composed of a first light-emitting zone and a second light-emitting zone, is disposed next and connecting to the light entrance surface;

a light source, disposed on the light entrance surface of the light guide plate;

a frame, disposed on the light emitting surface of the light guide plate; and a light absorbing material, disposed on the light emitting surface at a position corresponding to the interface between the first light-emitting zone and the second light-emitting zone.

7. The light-emitting keyboard of claim 6, further comprising:

a shielding layer, disposed at a position between the light-emitting surface of the light guide plate and the frame.

8. The light-emitting keyboard of claim 7, wherein the shielding layer is a transparent thin film having a portion thereof being printed with light-shielding inks.

9. The light-emitting keyboard of claim 7, wherein the shielding layer is divided into a first shielding zone and a second shielding zone while enabling the two shielding zones to be located respectively at positions corresponding to the first and the second light-emitting zones.

10. The light-emitting keyboard of claim 6, wherein the light absorbing material is a kind of ink.

* * * * *